United States Patent
Clark

(10) Patent No.: US 9,070,477 B1
(45) Date of Patent: Jun. 30, 2015

(54) BIT INTERLEAVED LOW VOLTAGE STATIC RANDOM ACCESS MEMORY (SRAM) AND RELATED METHODS

(71) Applicant: Mie Fujitsu Semiconductor Limited, Kuwana (JP)

(72) Inventor: Lawrence T. Clark, Phoenix, AZ (US)

(73) Assignee: Mie Fujitsu Semiconductor Limited, Kuwana (JP)

( * ) Notice: Subject to any disclaimer, the term of this patent is extended or adjusted under 35 U.S.C. 154(b) by 0 days.

(21) Appl. No.: 14/104,182

(22) Filed: Dec. 12, 2013

Related U.S. Application Data

(60) Provisional application No. 61/736,184, filed on Dec. 12, 2012.

(51) Int. Cl.
*G11C 11/419* (2006.01)
*G11C 11/412* (2006.01)

(52) U.S. Cl.
CPC ............ *G11C 11/419* (2013.01); *G11C 11/412* (2013.01)

(58) Field of Classification Search
None
See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,518,926 A | 5/1985 | Swanson | |
| 4,559,091 A | 12/1985 | Allen et al. | |
| 4,578,128 A | 3/1986 | Mundt et al. | |
| 4,617,066 A | 10/1986 | Vasudev | |
| 4,662,061 A | 5/1987 | Malhi | |
| 4,761,384 A | 8/1988 | Neppl et al. | |
| 4,780,748 A | 10/1988 | Cunningham et al. | |
| 4,819,043 A | 4/1989 | Yazawa et al. | |
| 4,885,477 A | 12/1989 | Bird et al. | |
| 4,908,681 A | 3/1990 | Nishida et al. | |
| 4,945,254 A | 7/1990 | Robbins | |
| 4,956,311 A | 9/1990 | Liou et al. | |
| 5,034,337 A | 7/1991 | Mosher et al. | |
| 5,091,324 A | 2/1992 | Hsu et al. | |

(Continued)

FOREIGN PATENT DOCUMENTS

| | | |
|---|---|---|
| EP | 0274278 A1 | 7/1988 |
| EP | 0312237 A2 | 4/1989 |

(Continued)

OTHER PUBLICATIONS

Werner, P et al., "Carbon Diffusion in Silicon", Oct. 1998, Applied Physics Letters, vol. 73, No. 17, pp. 2465-2467.

(Continued)

*Primary Examiner* — James G Norman
(74) *Attorney, Agent, or Firm* — Baker Botts L.L.P.

(57) ABSTRACT

A method can include applying a device power supply voltage to an integrated circuit including a static random access memory (SRAM) with transistors having at least a first threshold voltage (Vt); applying an array power supply voltage to cells of the SRAM that is near or below Vt; and in a write operation, reading data from at least a first group of the cells that is interleaved with a second group of the cells, and applying the read data to the bit lines of the first group of cells, while write data is applied to the bit lines of the second group of cells.

20 Claims, 6 Drawing Sheets

(56) References Cited

U.S. PATENT DOCUMENTS

| | | | |
|---|---|---|---|
| 5,144,378 | A | 9/1992 | Hikosaka |
| 5,156,989 | A | 10/1992 | Williams et al. |
| 5,156,990 | A | 10/1992 | Mitchell |
| 5,166,765 | A | 11/1992 | Lee et al. |
| 5,208,473 | A | 5/1993 | Komori et al. |
| 5,294,821 | A | 3/1994 | Iwamatsu |
| 5,298,763 | A | 3/1994 | Shen et al. |
| 5,369,288 | A | 11/1994 | Usuki |
| 5,373,186 | A | 12/1994 | Schubert et al. |
| 5,384,476 | A | 1/1995 | Nishizawa et al. |
| 5,426,328 | A | 6/1995 | Yilmaz et al. |
| 5,444,008 | A | 8/1995 | Han et al. |
| 5,552,332 | A | 9/1996 | Tseng et al. |
| 5,559,368 | A | 9/1996 | Hu et al. |
| 5,608,253 | A | 3/1997 | Liu et al. |
| 5,622,880 | A | 4/1997 | Burr et al. |
| 5,624,863 | A | 4/1997 | Helm et al. |
| 5,625,568 | A | 4/1997 | Edwards et al. |
| 5,641,980 | A | 6/1997 | Yamaguchi et al. |
| 5,663,583 | A | 9/1997 | Matloubian et al. |
| 5,712,501 | A | 1/1998 | Davies et al. |
| 5,719,422 | A | 2/1998 | Burr et al. |
| 5,726,488 | A | 3/1998 | Watanabe et al. |
| 5,726,562 | A | 3/1998 | Mizuno |
| 5,731,626 | A | 3/1998 | Eaglesham et al. |
| 5,736,419 | A | 4/1998 | Naem |
| 5,753,555 | A | 5/1998 | Hada |
| 5,754,826 | A | 5/1998 | Gamal et al. |
| 5,756,365 | A | 5/1998 | Kakumu |
| 5,763,921 | A | 6/1998 | Okumura et al. |
| 5,780,899 | A | 7/1998 | Hu et al. |
| 5,847,419 | A | 12/1998 | Imai et al. |
| 5,861,334 | A | 1/1999 | Rho |
| 5,877,049 | A | 3/1999 | Liu et al. |
| 5,885,876 | A | 3/1999 | Dennen |
| 5,889,315 | A | 3/1999 | Farrenkopf et al. |
| 5,895,954 | A | 4/1999 | Yasumura et al. |
| 5,865,003 | A | 5/1999 | Chiu |
| 5,899,714 | A | 5/1999 | Farremkopf et al. |
| 5,918,129 | A | 6/1999 | Fulford, Jr. et al. |
| 5,923,067 | A | 7/1999 | Voldman |
| 5,923,987 | A | 7/1999 | Burr |
| 5,936,868 | A | 8/1999 | Hall |
| 5,946,214 | A | 8/1999 | Heavlin |
| 5,985,705 | A | 11/1999 | Seliskar |
| 5,989,963 | A | 11/1999 | Luning et al. |
| 6,001,695 | A | 12/1999 | Wu |
| 6,020,227 | A | 2/2000 | Bulucea |
| 6,030,862 | A | 2/2000 | Kepler |
| 6,043,139 | A | 3/2000 | Eaglesham et al. |
| 6,060,345 | A | 5/2000 | Hause et al. |
| 6,060,364 | A | 5/2000 | Maszara et al. |
| 6,066,533 | A | 5/2000 | Yu |
| 6,072,217 | A | 6/2000 | Burr |
| 6,078,082 | A | 6/2000 | Bulucea |
| 6,087,210 | A | 7/2000 | Sohn |
| 6,087,691 | A | 7/2000 | Hamamoto |
| 6,088,518 | A | 7/2000 | Hsu |
| 6,091,286 | A | 7/2000 | Blauschild |
| 6,096,611 | A | 8/2000 | Wu |
| 6,103,562 | A | 8/2000 | Son et al. |
| 6,121,153 | A | 9/2000 | Kikkawa |
| 6,147,383 | A | 11/2000 | Kuroda |
| 6,153,920 | A | 11/2000 | Gossmann et al. |
| 6,157,073 | A | 12/2000 | Lehongres |
| 6,175,582 | B1 | 1/2001 | Naito et al. |
| 6,181,608 | B1 | 1/2001 | Keshavarzi et al. |
| 6,184,112 | B1 | 2/2001 | Maszara et al. |
| 6,190,979 | B1 | 2/2001 | Radens et al. |
| 6,194,259 | B1 | 2/2001 | Nayak et al. |
| 6,198,157 | B1 | 3/2001 | Ishida et al. |
| 6,201,761 | B1 | 3/2001 | Wollesen |
| 6,218,892 | B1 | 4/2001 | Soumyanath et al. |
| 6,218,895 | B1 | 4/2001 | De et al. |
| 6,221,724 | B1 | 4/2001 | Yu et al. |
| 6,229,188 | B1 | 5/2001 | Aoki et al. |
| 6,232,164 | B1 | 5/2001 | Tsai et al. |
| 6,235,597 | B1 | 5/2001 | Miles |
| 6,238,982 | B1 | 5/2001 | Krivokapic et al. |
| 6,245,618 | B1 | 6/2001 | An et al. |
| 6,255,174 | B1 | 7/2001 | Yu |
| 6,268,640 | B1 | 7/2001 | Park et al. |
| 6,271,070 | B2 | 8/2001 | Kotani et al. |
| 6,271,551 | B1 | 8/2001 | Schmitz et al. |
| 6,288,429 | B1 | 9/2001 | Iwata et al. |
| 6,297,082 | B1 | 10/2001 | Lin et al. |
| 6,297,132 | B1 | 10/2001 | Zhang et al. |
| 6,300,177 | B1 | 10/2001 | Sundaresan et al. |
| 6,313,489 | B1 | 11/2001 | Letavic et al. |
| 6,319,799 | B1 | 11/2001 | Ouyang et al. |
| 6,320,222 | B1 | 11/2001 | Forbes et al. |
| 6,323,525 | B1 | 11/2001 | Noguchi et al. |
| 6,326,666 | B1 | 12/2001 | Bernstein et al. |
| 6,335,233 | B1 | 1/2002 | Cho et al. |
| 6,358,806 | B1 | 3/2002 | Puchner |
| 6,380,019 | B1 | 4/2002 | Yu et al. |
| 6,391,752 | B1 | 5/2002 | Colinge et al. |
| 6,426,260 | B1 | 7/2002 | Hshieh |
| 6,426,279 | B1 | 7/2002 | Huster et al. |
| 6,432,754 | B1 | 8/2002 | Assaderaghi et al. |
| 6,444,550 | B1 | 9/2002 | Hao et al. |
| 6,444,551 | B1 | 9/2002 | Ku et al. |
| 6,449,749 | B1 | 9/2002 | Stine |
| 6,455,903 | B1 | 9/2002 | Yu |
| 6,461,920 | B1 | 10/2002 | Shirahata |
| 6,461,928 | B2 | 10/2002 | Rodder |
| 6,472,278 | B1 | 10/2002 | Marshall et al. |
| 6,482,714 | B1 | 11/2002 | Hieda et al. |
| 6,489,224 | B1 | 12/2002 | Burr |
| 6,492,232 | B1 | 12/2002 | Tang et al. |
| 6,500,739 | B1 | 12/2002 | Wang et al. |
| 6,503,801 | B1 | 1/2003 | Rouse et al. |
| 6,503,805 | B2 | 1/2003 | Wang et al. |
| 6,506,640 | B1 | 1/2003 | Ishida et al. |
| 6,518,623 | B1 | 2/2003 | Oda et al. |
| 6,521,470 | B1 | 2/2003 | Lin et al. |
| 6,534,373 | B1 | 3/2003 | Yu |
| 6,541,328 | B2 | 4/2003 | Whang et al. |
| 6,541,829 | B2 | 4/2003 | Nishinohara et al. |
| 6,548,842 | B1 | 4/2003 | Bulucea et al. |
| 6,551,885 | B1 | 4/2003 | Yu |
| 6,552,377 | B1 | 4/2003 | Yu |
| 6,573,129 | B2 | 6/2003 | Hoke et al. |
| 6,576,535 | B2 | 6/2003 | Drobny et al. |
| 6,600,200 | B1 | 7/2003 | Lustig et al. |
| 6,620,671 | B1 | 9/2003 | Wang et al. |
| 6,624,488 | B1 | 9/2003 | Kim |
| 6,627,473 | B1 | 9/2003 | Oikawa et al. |
| 6,630,385 | B1 | 10/2003 | Yu |
| 6,630,710 | B1 | 10/2003 | Augusto |
| 6,660,605 | B1 | 12/2003 | Liu |
| 6,662,350 | B2 | 12/2003 | Fried et al. |
| 6,667,200 | B2 | 12/2003 | Sohn et al. |
| 6,670,260 | B1 | 12/2003 | Yu et al. |
| 6,693,333 | B1 | 2/2004 | Yu |
| 6,730,568 | B2 | 5/2004 | Sohn |
| 6,737,724 | B2 | 5/2004 | Hieda et al. |
| 6,743,291 | B2 | 6/2004 | Ang et al. |
| 6,743,684 | B2 | 6/2004 | Liu |
| 6,751,519 | B1 | 6/2004 | Satya et al. |
| 6,753,230 | B2 | 6/2004 | Sohn et al. |
| 6,760,900 | B2 | 7/2004 | Rategh et al. |
| 6,770,944 | B2 | 8/2004 | Nishinohara et al. |
| 6,787,424 | B1 | 9/2004 | Yu |
| 6,797,553 | B2 | 9/2004 | Adkisson et al. |
| 6,797,602 | B1 | 9/2004 | Kluth et al. |
| 6,797,994 | B1 | 9/2004 | Hoke et al. |
| 6,808,004 | B2 | 10/2004 | Kamm et al. |
| 6,808,994 | B1 | 10/2004 | Wang |
| 6,813,750 | B2 | 11/2004 | Usami et al. |
| 6,821,825 | B2 | 11/2004 | Todd et al. |
| 6,821,852 | B2 | 11/2004 | Rhodes |
| 6,822,297 | B2 | 11/2004 | Nandakumar et al. |
| 6,828,620 | B2 | 12/2004 | Pass et al. |

(56) References Cited

U.S. PATENT DOCUMENTS

| | | |
|---|---|---|
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jaehne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,095,659 B2 | 8/2006 | King |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,277,309 B1 | 10/2007 | Banachowicz et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,361,562 B2 | 4/2008 | Kim |
| 7,372,721 B2 | 5/2008 | Sachdev et al. |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,423,899 B2 | 9/2008 | Tang et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawae et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,692,976 B2 | 4/2010 | Cheng et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,732,286 B2 | 6/2010 | Hanafi et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |

(56) References Cited

U.S. PATENT DOCUMENTS

| | | |
|---|---|---|
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,829,957 B2 | 11/2010 | Kato et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,939,898 B2 | 5/2011 | Smayling et al. |
| 7,941,776 B2 | 5/2011 | Majumder et al. |
| 7,943,468 B2 | 5/2011 | Curello et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,008,158 B2 | 8/2011 | Chang et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,321 B2 | 11/2011 | Helm et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,081,502 B1 | 12/2011 | Rahim et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,273,629 B2 | 9/2012 | Wang et al. |
| 8,286,180 B2 | 10/2012 | Foo |
| 8,288,798 B2 | 10/2012 | Passlack |
| 8,298,895 B1 | 10/2012 | Alptekin |
| 8,299,562 B2 | 10/2012 | Li et al. |
| 8,324,059 B2 | 12/2012 | Guo et al. |
| 8,350,327 B2 | 1/2013 | Chung et al. |
| 8,351,248 B1 | 1/2013 | Hart |
| 8,354,321 B2 | 1/2013 | Colombeau et al. |
| 8,520,454 B2 | 8/2013 | Ouchi |
| 8,578,319 B2 | 11/2013 | Papanikpolaou et al. |
| 8,595,671 B2 | 11/2013 | He |
| 8,711,614 B1 | 4/2014 | Lee et al. |
| 2001/0014495 A1 | 8/2001 | Yu |
| 2002/0033511 A1 | 3/2002 | Babcock et al. |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2004/0185629 A1 | 9/2004 | Mansoori et al. |
| 2005/0056877 A1 | 3/2005 | Rueckes et al. |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0017100 A1 | 1/2006 | Bol et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0091481 A1 | 5/2006 | Li et al. |
| 2006/0154428 A1 | 7/2006 | Dokumaci |
| 2006/0157794 A1 | 7/2006 | Doyle et al. |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0138953 A1 | 6/2008 | Challa et al. |
| 2008/0169493 A1 | 7/2008 | Lee et al. |
| 2008/0169516 A1 | 7/2008 | Chung |

(56) References Cited

U.S. PATENT DOCUMENTS

| | | | |
|---|---|---|---|
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0003105 A1 | 1/2009 | Itoh et al. |
| 2009/0057746 A1 | 3/2009 | Sugll et al. |
| 2009/0057762 A1 | 3/2009 | Bangsaruntip et al. |
| 2009/0108350 A1 | 4/2009 | Cai et al. |
| 2009/0121298 A1 | 5/2009 | Furukawa et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren et al. |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0063211 A1 | 3/2012 | Sharma et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |
| 2013/0083591 A1* | 4/2013 | Wuu et al. | 365/154 |

FOREIGN PATENT DOCUMENTS

| | | |
|---|---|---|
| EP | 0531621 A2 | 3/1993 |
| EP | 0683515 A1 | 11/1995 |
| EP | 0889502 A2 | 1/1999 |
| EP | 1450394 A1 | 8/2004 |
| JP | 59193066 A1 | 1/1984 |
| JP | 4186774 A1 | 3/1992 |
| JP | 8288508 A1 | 1/1996 |
| JP | 8153873 A1 | 6/1996 |
| JP | 2004087671 A1 | 3/2004 |
| KR | 10-0794094 B1 | 7/2003 |
| WO | 2011062788 A1 | 5/2011 |

OTHER PUBLICATIONS

Yan, Ran-Hong et al., "Scaling the Si MOSFET: From Bulk to SOI to Bulk", Jul. 1992, IEEE Transactions on Electron Devices, vol. 39, No. 7.

Dreslinkski, Ronald G. et al., "Near-Threshold Computing: Reclaiming Moore's Law Through Energy Efficient Integrated Circuits", Feb. 2010, Proceedings of the IEEE, vol. 98, Issue 2, IEEE.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., Integrating Intrinsic Parameter Fluctuation Description into BSIMSOI to Forecast sub-15 nm UTB SOI based 6T SRAM Operation, Solid-State Electronics (50), pp. 86-93.

Wong, H et al., "Nanoscale CMOS", Proceedings of the IEEE, Vo. 87, No. 4, pp. 537-570.

Machine Translation of KR 10-0794094 Submitted herewith.

Banerjee et al., "Compensating Non-Optical Effects using Electrically-Driven Optical Proximity Correction", Proc. of SPIE, vol. 7275, 2009.

Cheng et al., "Extremely Thin SOI (ETSOI) CMOS with Record Low Variability for Low Power System-on-Chip Applications", IEDM 2009, Dec. 2009.

Cheng et al., "Fully Depleted Extremely Thin SOI Technology Fabricated by a Novel Integration Scheme Featuring Implant-Free, Zero-Silicon-Loss, and Faceted Raised Source/Drain", 2009 Symposium on VLSI Technology Digest of Technical Papers, 2009.

Drennan et al., "Implications of Proximity Effects for Analog Design", Custom Integrated Circuits Conference, 2006, CICC '06, IEEE, Sep. 10-13, 2006, pp. 169-176.

Hook et al., "Lateral Ion Implant Straggle and Mask Proximity Effect", IEEE Transactions on Electron Devices, vol. 50, No. 9, Sep. 2003.

Hori et al., "A 0.1 um CMOS with a Step Channel Profile Formed by Ultra High Vacuum CVD and In-Situ Doped Ions", IEDM 1993, May 12, 1993.

Matsuhashi et al., "High-Performance Double-Layer Epitaxial-Channel PMOSFET Compatible with a Single Gate CMOSFET", 1996 Symposium on VLSI Technology Digest of Technical Papers, 1996.

Shag et al., "Boron diffusion in silicon: the anomalies and control by point defect engineering", Materials Science and Engineering R 42 (2003), Nov. 2003, pp. 65-114.

Sheu et al., "Modeling the Well-Edge Proximity Effect in Highly Scaled MOSFETs", IEEE Transactions on Electron Devices, vol. 53, No. 11, Nov. 2006, pp. 2792-2798.

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, 1995, pp. 23-24.

Chau, R et al., "A 50nm Depleted-Substrate CMOS Transistor (DST)", Electron Device Meeting 2001, IEDM Technical Digest, IEEE International, 2001, pp. 29.1.1-29.1.4.

Ducroquet, F et al. "Fully Depleted Silicon-On-Insulator nMOSFETs with Tensile Strained High Carbon Content Si1-yCy Channel", 2006, ECS 210th Meeting, Abstract 1033.

Ernst, T et al., "Nanoscaled MOSFET Transistors on Strained Si, SiGe, Ge Layers: Some Integration and Electrical Properties Features", 2006, ECS Trans. 2006, vol. 3, Issue 7, pp. 947-961.

Goesele, U et al., Diffusion Engineering by Carbon in Silicon, 2000, Mat. Res. Soc. Symp. vol. 610.

Hokazono, A et al., "Steep Channel & Halo Profiles Utilizing Boron-Diffusion-Barrier Layers (Si:C) for 32 nm Node and Beyond", 2008, 2008 Symposium on VLSI Technology Digest of Technical Papers, pp. 112-113.

Hokazono, A et al., "Steep Channel Profiles in n/pMOS Controlled by Boron-Doped Si:C Layers for Continual Bulk-CMOS Scaling", 2009, IEDM09-676 Symposium, pp. 29.1.1-29.1.4.

Holland, OW and Thomas, DK "A Method to Improve Activation of Implanted Dopants in SiC", 2001, Oak Ridge National Laboratory, Oak Ridge, TN.

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", 1996, IEDM 96, pp. 459-462.

Lavéant, P. "Incorporation, Diffusion and Agglomeration of Carbon in Silicon", 2002, Solid State Phenomena, vols. 82-84, pp. 189-194.

(56) References Cited

OTHER PUBLICATIONS

Noda, K et al., "A 0.1-µm Delta-Doped MOSFET Fabricated with Post-Low-Energy Implanting Selective Epitaxy", Apr. 1998, IEEE Transactions on Electron Devices, vol. 45, No. 4, pp. 809-814.

Ohguro, T et al., "An 0.18-µm CMOS for Mixed Digital and Analog Aplications with Zero-Volt-Vth Epitaxial-Channel MOSFET's", Jul. 1999, IEEE Transactions on Electron Devices, vol. 46, No. 7, pp. 1378-1383.

Pinacho, R et al., "Carbon in Silicon: Modeling of Diffusion and Clustering Mechanisms", Aug. 2002, Journal of Applied Physics, vol. 92, No. 3, pp. 1582-1588.

Robertson, LS et al., "The Effect of Impurities on Diffusion and Activation of Ion Implanted Boron in Silicon", 2000, Mat. Res. Soc. Symp. vol. 610.

Scholz, R et al., "Carbon-Induced Undersaturation of Silicon Self-Interstitials", Jan. 1998, Appl. Phys. Lett. 72(2), pp. 200-202.

Scholz, RF et al., "The Contribution of Vacancies to Carbon Out-Diffusion in Silicon", Jan. 1999, Appl. Phys. Lett., vol. 74, No. 3, pp. 392-394.

Stolk, PA et al., "Physical Mechanisms of Transient Enhanced Dopant Diffusion in Ion-Implanted Silicon", May 1997, J. Appl. Phys. 81(9), pp. 6031-6050.

Thompson, S et al., "MOS Scaling: Transistor Challenges for the 21st Century", 1998, Intel Technology Journal Q3'1998, pp. 1-19.

Wann, C. et al., "Channel Profile Optimization and Device Design for Low-Power High-Performance Dynamic-Threshold MOSFET", 1996, IEDM 96, pp. 113-116.

English Translation of JP 8153873 Submitted herewith.

\* cited by examiner data on unselected columns matches the cell data before WWLX is asserted

BIT INTERLEAVED LOW VOLTAGE STATIC RANDOM ACCESS MEMORY (SRAM) AND RELATED METHODS

CROSS-REFERENCE TO RELATED APPLICATIONS

This non-provisional application claims the benefit of U.S. Provisional Application 61/736,184, entitled, "Bit Interleaved Low Voltage 8-T SRAM and Related Methods", filed on Dec. 12, 2012 the entirety of which is hereby incorporated by reference.

TECHNICAL FIELD

The present invention relates generally to static random access memory (SRAM) devices, and more particularly, to SRAM devices with interleaved memory cells.

BACKGROUND

In the continuing drive to reduce power requirements for electronic devices, attempts have been made to reduce power by use of low operating voltages. In certain types of circuits known as "near threshold" circuits, the supply voltage is maintained at a level only slightly above the "threshold voltage", the point where a transistor begins to start conducting current. In other circuits known as "sub threshold" circuits the supply voltage is maintained at a level below the threshold voltage. For many circuit implementations, the most energy efficient operation occurs when the supply voltage is just slightly higher than the threshold voltage (near threshold) or below the threshold voltage (sub-threshold). A supply voltage that is substantially higher than the threshold can result in increased speed and reduced errors, but has substantial power costs.

Power efficient operation of memory array circuits is of particular importance because of their large per die transistor count and consequent large power usage. For example, static random access memory (SRAM) is commonly used as part of integrated circuit designs. As process technology has scaled it can become difficult to maintain high SRAM yields since they can be more vulnerable to process variations. For example, in scaled process technologies it can become increasingly difficult to control the variation of transistor parameters because of a variety of factors, including, for example, Random Dopant Fluctuation (RDF). Other reasons for this variation include dopant scattering effect, such as the well proximity effect, that makes the placement of dopants in metal-oxide-semiconductor field effect transistors (MOSFETs) increasingly difficult as transistor size is reduced. Transistor variability arising from dopant effects worsens as transistors are reduced in size, with each misplaced dopant atom having a greater relative effect on transistor properties, as a result of the overall reduction in the number of dopant atoms.

Such random variations between neighboring MOSFETs can have a significant impact on the read and write margins of the SRAM cell. To maintain read robustness for the cell, an eight transistor (8-T) SRAM design can be used, which can be independently optimized for read and write operations since there are separate ports for each operation. Using an 8-T SRAM cell can also lower the minimum operating voltage of the SRAM, to result in lower SRAM power consumption.

However, SRAM cells operating at low voltages can have increased susceptibility to soft errors. Soft errors are faults induced by an ionizing radiation particle strike that upsets internal data states of the SRAM cell while the circuit itself is undamaged. Even though it is unpredictable, soft error susceptibility can be a significant reliability problem for SRAM cells. Typically, SRAM designs use parity checking for single bit soft error detection, or parity based Single Error Correction/Double Error Detection (SEC-DED) codes to fix single bit soft errors. However, the probability of multi-bit soft errors increases as process technology is scaled. If all the bits in a single data word of the SRAM are physically located next to each other, a multi-bit soft error can result in multiple bits of the same word being corrupted. Such errors cannot be fixed with SEC-DED error correction codes. Other codes, e.g., BCH codes providing DEC-TED capability can also be used but are more complicated, and codes with greater robustness can be too complicated for use with low-latency SRAM access.

One of the methods to avoid single word multi-bit soft errors is to interleave bits, such that bits of the same data word are not physically adjacent. Bit interleaving can improve robustness as to soft errors because a multi-bit soft error can then manifest as single bit errors for multiple words. Therefore, for a bit interleaved SRAM the multi-bit soft error can be fixed with SEC-DED error correction codes since each corrupted word is likely to have only a single upset bit.

Although bit interleaving is effective in avoiding single word multi-bit soft errors, it also results in a "half select" disturb problem. The half select disturb problem arises from the fact that, during a write operation for a bit interleaved SRAM, a write word line for physically adjacent interleaved SRAM cells that belong to different logical words is enabled. Thus, SRAM cells (in columns) that belong to those logical words for which a write operation is not being performed, can have an active write word line while their write bit lines are unselected (generally floated after being precharged to the high supply voltage). Cells having an enabled write word line and unselected write bit lines are thus referred to as half selected cells, in that these cells are reading while the intended SRAM cells in other columns are writing. The half select disturb problem can arise in bit interleaved SRAMs using any suitable SRAM cell, including six-transistor (6-T) and 8-T SRAM cells. However, the half select disturb problem can have a significant impact on the robustness of 8-T SRAMs since it results in the half selected cells being read out on the write bit lines, and conventional 8-T SRAM cells are typically not designed to be stable under these conditions (the read and write ports in a 8-T SRAM cell are separated, and the number of transistors in the cell is increased from 6 to 8 at least in part to allow lower voltage operation by separating the read and write ports). By contrast, conventional 6-T SRAM cells are optimized to allow the same port to be used for both read and write operations, and therefore, the half select disturb problem may not impact these cells as severely as conventional 8-T SRAM cells. Therefore, 8-T SRAM cells have typically not been used to implement bit-interleaved SRAMs, and therefore, they have typically been used for applications that do not have high reliability requirements and do not use bit interleaving.

DETAILED DESCRIPTION

Various embodiments will now be described in detail with reference to a number of drawings. The embodiments show static random access memory (SRAM) cells with enhanced stability for half selected cells that can be bit interleaved to provide enhanced reliability, including when operated at near or sub-threshold voltage levels. In particular embodiments, one or more transistors of the SRAM cell can have a highly doped "screening" region formed below a channel that can be biased via a body terminal. While the circuits and related methods described herein can be used to enhance the stability of half selected SRAM cells implemented using eight transistors, such circuits and methods can be utilized for SRAM cells having more than 8 transistors, or less than 8 transistors.

Figure 1A:
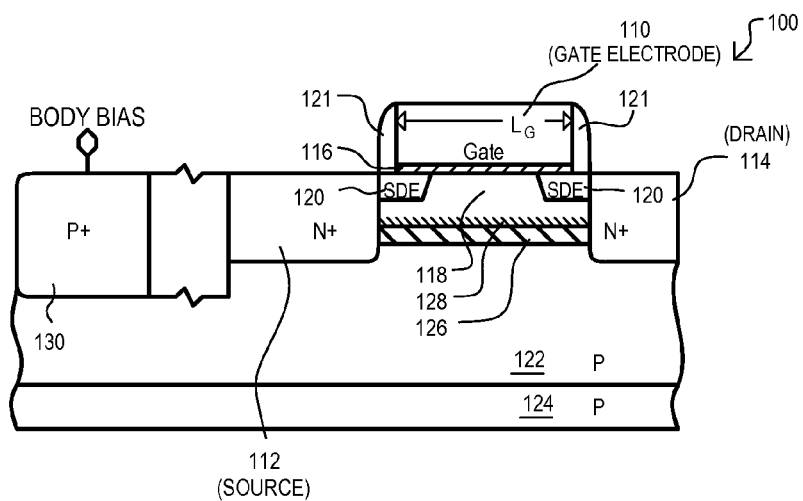
FIG. 1A is a side cross sectional view of a deeply depleted channel (DDC) transistor that can be included in embodiments.

FIG. 1A shows an embodiment of a deeply depleted channel (DDC) transistor 100 having an enhanced body coefficient, along with the ability to set threshold voltage Vt with enhanced precision, that can be included in embodiments. The DDC transistor 100 includes a gate electrode 110, source 112, drain 114, and a gate dielectric 116 positioned over a substantially undoped channel 118. Optionally, lightly doped source and drain extensions (SDE) 120, positioned respectively adjacent to source 112 and drain 114, extend toward each other, setting the transistor channel length (LG). In the embodiment shown, insulating spacers 121 can be formed on sides of gate electrode 110.

In FIG. 1A, the DDC transistor 100 is shown as an N-channel transistor having a source 112 and drain 114 made of N-type dopant material, formed upon a substrate 124, such as a P-type doped silicon substrate, providing a P-well 122 formed on a substrate 124. In addition, the N-channel DDC transistor in FIG. 1A includes a highly doped screening region 126 made of P-type dopant material, and, optionally, a threshold voltage set region 128 made of P-type dopant material. Screening region 126 can be biased via a body tap 130. It will be understood that, with appropriate changes to dopant materials, a P-channel DDC transistor can be formed.

Figure 1B:
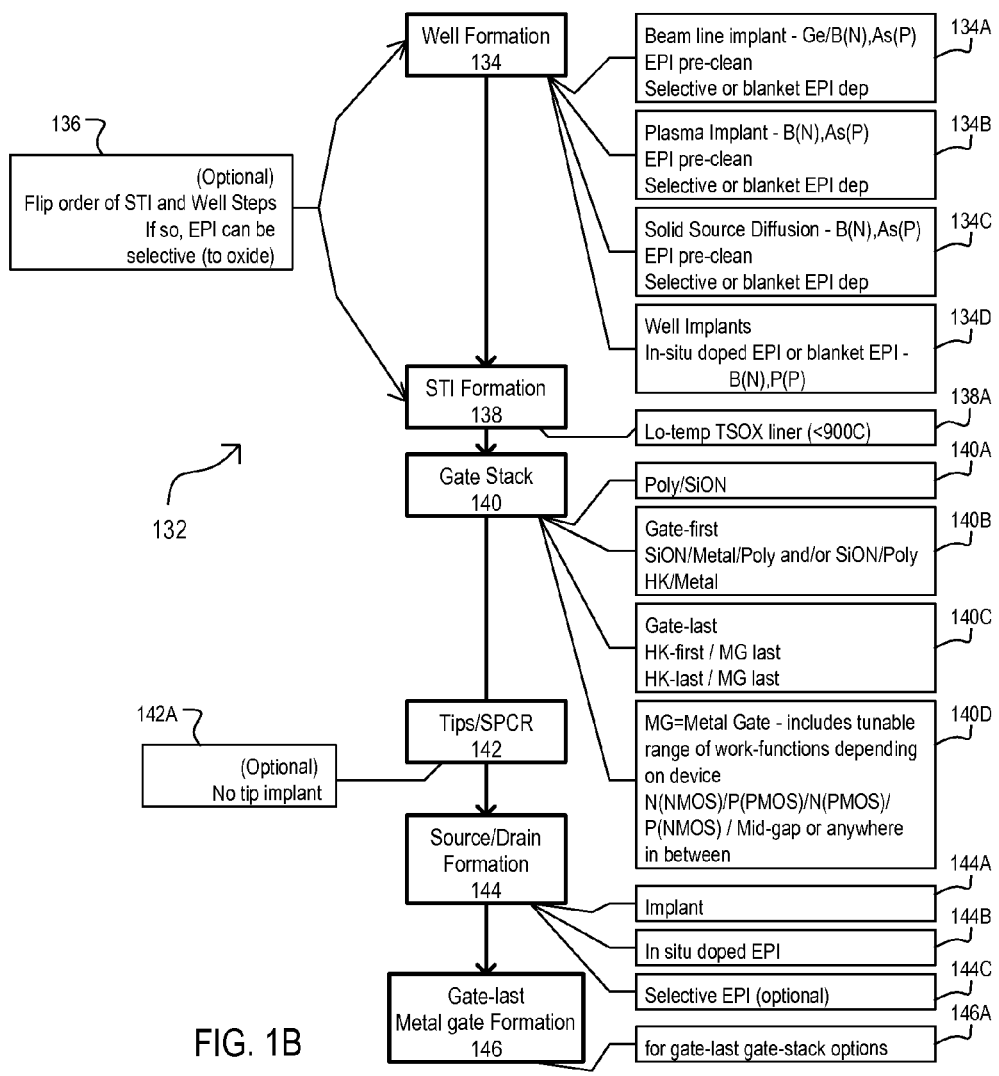
FIG. 1B is a flow diagram showing methods of making DDC transistors according to various embodiments.

FIG. 1B is a flow diagram 132 illustrating a general method for forming a DDC transistor having an enhanced body coefficient and reduced threshold variation (σVt), in accordance with the various embodiments described herein. The process illustrated in FIG. 1B is intended to be general and broad in its description, and more detailed embodiments and examples are set forth below. Each block in the flow diagram is illustrated and described in further detail below, in conjunction with the various alternatives associated with each block illustrated in FIG. 1B.

In step 134, the process begins at well formation, which can include one or more different process steps in accordance with different embodiments. The well formation step 134 includes the steps for forming the screening region 126, the threshold voltage set region 128 (if present), and the substantially undoped channel 118. As indicated by 136, the well formation 134 can be before or after STI (shallow trench isolation) formation 138.

The well formation 134 can include forming the screening region 126 by implanting dopants into the P-well 122, followed by an epitaxial (EPI) pre-clean process that is followed by a blanket or selective EPI deposition. Various alternatives for performing these steps are illustrated in FIG. 1B. In accordance with one embodiment, well formation 134 can include a beam line implant of Ge/B (N), As (P), followed by an epitaxial (EPI) pre-clean process, and followed by a non-selective blanket EPI deposition, as shown in 134A.

Alternatively, the well formation 134 can include using a plasma implant of B (N), As (P), followed by an EPI pre-clean, then a non-selective (blanket) EPI deposition, as shown in 134B. The well formation 134 can alternatively include a solid-source diffusion of B(N), As(P), followed by an EPI pre-clean, and followed by a non-selective (blanket) EPI deposition, as shown in 134C. As yet another alternative, well formation 134 can also include well implants, followed by in-situ doped selective EPI of B (N), P (P) as shown in 134D. As will be described further below, the well formation can be configured with different types of devices in mind, including DDC transistors, legacy transistors, high threshold voltage (VT) transistors, low VT transistors, improved σVT transistors, and standard or legacy σVT transistors. Embodiments described herein allow for any one of a number of devices configured on a common substrate with different well structures and according to different parameters.

In step 134, Boron (B), Indium (I), or other P-type materials can be used for P-type implants, and arsenic (As), antimony (Sb) or phosphorous (P) and other N-type materials can be used for N-type implants. In certain embodiments, the screening region 126 can have a dopant concentration between about $5 \times 10^{18}$ to $1 \times 10^{20}$ dopant atoms/cm$^3$, with the selected dopant concentration dependent on the desired threshold voltage as well as other desired transistor characteristics. A germanium (Ge), carbon (C), or other dopant migration resistant layer can be incorporated above the screening region to reduce upward migration of dopants. The dopant migration resistant layer can be formed by way of ion implantation, in-situ doped epitaxial growth or other process. In certain embodiments, a dopant migration resistant layer can also be incorporated to reduce downward migration of dopants.

In certain embodiments of the DDC transistor, an optional threshold voltage set region 128 is positioned above the screening region 126. The threshold voltage set region 128 can be either adjacent to, incorporated within or vertically offset from the screening region. In certain embodiments, the threshold voltage set region 128 is formed by delta doping, controlled in-situ deposition, or atomic layer deposition. In alternative embodiments, the threshold voltage set region 128 can be formed by way of controlled outdiffusion of dopant material from the screening region 126 into an undoped epitaxial layer, or by way of a separate implantation into the substrate following formation of the screening region 126, before the undoped epitaxial layer 118 is formed. Setting of the threshold voltage for the transistor is implemented by suitably selecting dopant concentration and thickness of the threshold voltage set region 128, as well as maintaining a separation of the threshold voltage set region 128 from the gate dielectric 116, leaving a substantially undoped channel layer 118 directly adjacent to the gate dielectric 116. In certain embodiments, the threshold voltage set region 128 can have a dopant concentration between about $1 \times 10^{18}$ dopant atoms/cm$^3$ and about $1 \times 10^{19}$ dopant atoms per cm$^3$. In alternative embodiments, the threshold voltage set region 128 can have a dopant concentration that is approximately less than half of the concentration of dopants in the screening region 126.

In certain embodiments, an over-layer of the channel is formed above the screening region 126 and threshold voltage set region 128 by way of a blanket or selective EPI deposition (as shown in the alternatives shown in 134A-D), to result in a substantially undoped channel region 118 of a thickness tailored to the technical specifications of the device. As a general matter, the thickness of the substantially undoped channel region 118 ranges from approximately 5-25 nm, with the selected thickness based upon the desired threshold voltage for the transistor. Preferably, a blanket EPI deposition step is performed after forming the screening region 126, and the threshold voltage setting region 128 is formed by controlled outdiffusion of dopants from the screening region 126 into a portion of the blanket EPI layer, as described below. Dopant migration resistant layers of C, Ge, or the like can be utilized as needed to prevent dopant migration from the threshold voltage set region 128 into the substantially undoped channel region 118, or alternatively from the screening region 126 into the threshold voltage set region 128.

In addition to using dopant migration resistant layers, other techniques can be used to reduce upward migration of dopants from the screening region 126 and the threshold voltage set region 128, including but not limited to low temperature processing, selection or substitution of low migration dopants such as antimony or indium, low temperature or flash annealing to reduce interstitial dopant migration, or any other technique to reduce movement of dopant atoms can be used.

As described above, the substantially undoped channel region 118 is positioned above the threshold voltage set region 128. Preferably, the substantially undoped channel region 118 has a dopant concentration less than $5 \times 10^{17}$ dopant atoms per cm$^3$ adjacent or near the gate dielectric 116. In some embodiments, the substantially undoped channel region 118 can have a dopant concentration that is specified to be approximately less than one tenth of the dopant concentration in the screening region 126. In still other embodiments, depending on the transistor characteristics desired, the substantially undoped channel region 118 may contain dopants so that the dopant concentration is elevated to above $5 \times 10^{17}$ dopant atoms per cm$^3$ adjacent or near the gate dielectric 116 or by using a very light dose of halo implants. Preferably, the substantially undoped channel region 118 remains substantially undoped by avoiding the use of high dosage halo or other channel implants.

Referring still to FIG. 1B, STI formation 138, which, again, can occur before or after well formation 134, can include a low temperature trench sacrificial oxide (TSOX) liner, which is formed at a temperature lower than 900° C. as shown by 138A. Embodiments that form the STI structures after the blanket EPI deposition step, using a process that remains within a low thermal budget, can reduce dopant migration from the previously formed screening region 126 and threshold voltage setting region 128.

As shown in step 140 (FIG. 1B), a gate stack can be formed or otherwise constructed above the substantially undoped channel region 118 in a number of different ways, from different materials, and of different work functions. One option is a polysilicon(Poly)/SiON gate stack 140A. Another option is a gate-first process 140B that includes SiON/Metal/Poly and/or SiON/Poly, followed by High-K/Metal Gate. Another option, a gate-last process 140C includes a high-K/metal gate stack wherein the gate stack can either be formed with "Hi-K first-Metal gate last" flow or and "Hi-K last-Metal gate last" flow. Yet another option, 140D is a metal gate that includes a tunable range of work functions depending on the device construction. Preferably, the metal gate materials for n-channel MOS (NMOS) and p-channel MOS (PMOS) are selected to near mid-gap, to take full advantage of the DDC transistor. However, traditional metal gate work function band-gap settings may also be used. In one scheme, metal gate materials can be switched between NMOS and PMOS pairs as a way to attain the desired work functions for given devices.

A gate stack may be formed or otherwise constructed above the substantially undoped channel region 118 in a number of different ways, from different materials including polysilicon and metals to form what is known as "high-k metal gate". The metal gate process flow may be "gate 1st" or "gate last". Preferably, the metal gate materials for NMOS and PMOS are selected to near mid-gap, to take full advantage of the DDC transistor. However, traditional metal gate work function band-gap settings may also be used. In one scheme, metal gate materials can be switched between NMOS and PMOS pairs as a way to attain the desired work functions for given devices. Following formation of the gate stack, source/drain portions may be formed. Typically, the extension portions are implanted, followed by additional spacer formation and then implant or, alternatively, selective epitaxial deposition of deep source/drain regions.

In step 142, Source/Drain tips can be implanted. The dimensions of the tips can be varied as required, and will depend in part on whether gate spacers (SPGR) are used. In one embodiment, Source/Drain tips are not formed (step 142A), and there may be no tip implant.

In step 144, the source 112 and drain 114 can be formed preferably using conventional processes and materials such as ion implantation (144A) and in-situ doped epitaxial deposition (144B). Optionally, as shown in step 144C, PMOS or NMOS selective EPI layers can be formed in the source and drain regions as performance enhancers for strained channels. Source 112 and drain 114 can further include raised and/or recessed source/drains, asymmetrically doped, counter-doped or crystal structure modified source/drains, or implant doping of source/drain extension regions according to LDD (lightly doped drain) techniques, provided that the thermal budget for any anneal steps be within the boundaries of what is required to keep the screening region 126 and threshold voltage setting region 128 substantially intact.

In step 146, a metal gate is formed in accordance with a gate last process. Step 146 is optional and may be performed only for gate-last processes (146A). Step 146 or an alternative metal gate scheme can be used if the gate stack 140 is a metal gate. Otherwise, a polysilicon gate may be used.

Referring back to FIG. 1A, the channel 118 contacts and extends between the source 112 and the drain 114, and supports movement of mobile charge carriers between the source and the drain. In operation, when gate electrode voltage is applied to the DDC transistor 100 at a predetermined level, a depletion region formed in the substantially undoped channel 118 can extend to the screening region 126, since channel depletion depth is a function of the integrated charge from dopants in the doped channel lattice, and the substantially undoped channel 118 has very few dopants. The screening region 126, if fabricated according to specification, effectively pins the depletion region to define the depletion zone width.

As will also be appreciated, position, concentration, and thickness of the screening region 126 can be important factors in the design of the DDC transistor. In certain embodiments, the screening region 126 is located above the bottom of the source and drain junctions. A screening region 126 can be doped to cause a peak dopant concentration to define the edge of the depletion width when the transistor is turned on. Such a doping of a screening region 126 can include methods such as delta doping, broad dopant implants, or in-situ doping is preferred, since the screening region 126 should have a finite thickness to enable the screening region 126 to adequately screen the well below, while avoiding the creation of a path for excessive junction leakage. When transistors are configured to have such screening regions, the transistor can simultaneously have good threshold voltage matching, high output resistance, low junction leakage, good short channel effects, and still have an independently controllable body due to a strong body effect. In addition, multiple DDC transistors having different threshold voltages can be easily implemented by customizing the position, thickness, and dopant concentration of the threshold voltage set region 128 and/or the screening region 126 while at the same time achieving a reduction in the threshold voltage variation.

In one embodiment, the screening region is positioned such that the top surface of the screening region is located approximately at a distance of Lg/1.5 to Lg/5 below the gate (where Lg is the gate length). In one embodiment, the threshold voltage set region has a dopant concentration that is approximately $\frac{1}{10}$ of the screening region dopant concentration. In certain embodiments, the threshold voltage set region is thin so that the combination of the threshold voltage set region and the screening region is located approximately within a distance of Lg/1.5 to Lg/5 below the gate.

Modifying threshold voltage by use of a threshold voltage set region 128 positioned above the screening region 126 and below the substantially undoped channel 118 is an alternative technique to conventional threshold voltage implants for adjusting threshold voltage. Care must be taken to prevent dopant migration into the substantially undoped channel 118, and use of low temperature anneals and anti-migration materials such as carbon or germanium can be included in embodiments. More information about the formation of the threshold voltage set region 128 and the DDC transistor is found in pending U.S. patent application Ser. No. 12/895,785 filed Sep. 30, 2010, the entirety of which disclosure is herein incorporated by reference.

Yet another technique for modifying threshold voltage relies on selection of a gate material having a suitable work function. The gate electrode 110 can be formed from conventional materials, preferably including, but not limited to, metals, metal alloys, metal nitrides and metal silicides, as well as laminates thereof and composites thereof. In certain embodiments the gate electrode 110 may also be formed from polysilicon, including, for example, highly doped polysilicon and polysilicon-germanium alloy. Metals or metal alloys may include those containing aluminum, titanium, tantalum, or nitrides thereof, including titanium containing compounds such as titanium nitride. Formation of the gate electrode 110 can include silicide methods, chemical vapor deposition methods and physical vapor deposition methods, such as, but not limited to, evaporative methods and sputtering methods.

Typically, the gate electrode 110 has an overall thickness from about 1 to about 500 nanometers. In certain embodiments, metals having a work function intermediate between band edge and mid-gap can be selected. As discussed in pending U.S. patent application Ser. No. 12/960,266 filed Dec. 3, 2010, the entirety of which disclosure is herein incorporated by reference, such metal gates simplify swapping of PMOS and NMOS gate metals to allow a reduction in mask steps and different required metal types for systems on a chip or other die supporting multiple transistor types.

Applied bias to the screening region 126 is yet another technique for modifying threshold voltage of a DDC transistor 100. The screening region 126 sets the body effect for the transistor and allows for a higher body effect than is found in conventional FET technologies. For example, a body tap 130 to the screening region 126 of the DDC transistor can be formed in order to provide further control of threshold voltage. The applied bias can be either reverse or forward biased, and can result in significant changes to threshold voltage. Bias can be static or dynamic, and can be applied to isolated transistors, or to groups of transistors that share a common well. Biasing can be static to set threshold voltage at a fixed set point, or dynamic, to adjust to changes in transistor operating conditions or requirements. In certain embodiments, biasing can be used switch between sub and near threshold transistor operating conditions for circuitry, permitting substantial savings in overall power usage. Various suitable biasing techniques are disclosed in U.S. Pat. No. 8,273,617 issued Sep. 25, 2012, the entirety of which disclosure is herein incorporated by reference.

Advantageously, DDC transistors created in accordance with the foregoing embodiments, structures, and processes, can have a reduced mismatch arising from scattered or random dopant variations as compared to conventional MOSFETs. In certain embodiments, the reduced variation results from the adoption of structures such as the screening region, the optional threshold voltage set region, and the epitaxially grown channel region. In certain alternative embodiments, mismatch between DDC transistors can be reduced by implanting the screening layer across multiple DDC transistors before the creation of transistor isolation structures, and forming the channel layer as a blanket epitaxial layer that is grown before the creation of transistor epitaxial structures. In certain embodiments, the screening region has a substantially uniform concentration of dopants in a lateral plane. The DDC transistor can be formed using a semiconductor process having a thermal budget that allows for a reasonable throughput while managing the diffusivities of the dopants in the channel. Further examples of transistor structure and manufacture suitable for use in DDC transistors are disclosed in U.S. Pat. No. 8,273,617 (previously mentioned above) as well as U.S. Pat. No. 8,530,286, issued Sep. 10, 2013 and U.S. patent application Ser. No. 12/971,955 filed on Dec. 17, 2010, the respective contents of which are incorporated by reference herein.

Figure 2A:
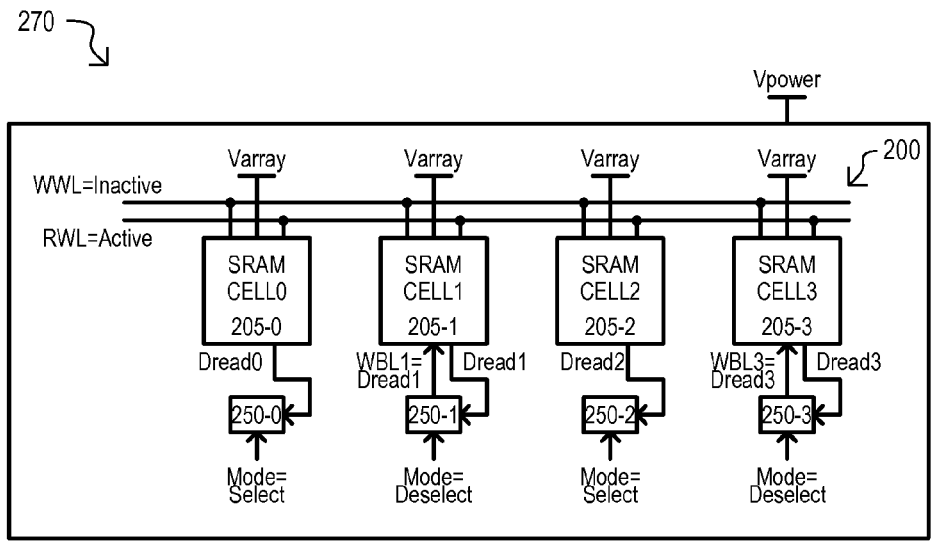
FIGS. 2A and 2B are block diagrams showing an integrated circuit and operations according to an embodiment.
Figure 2B:
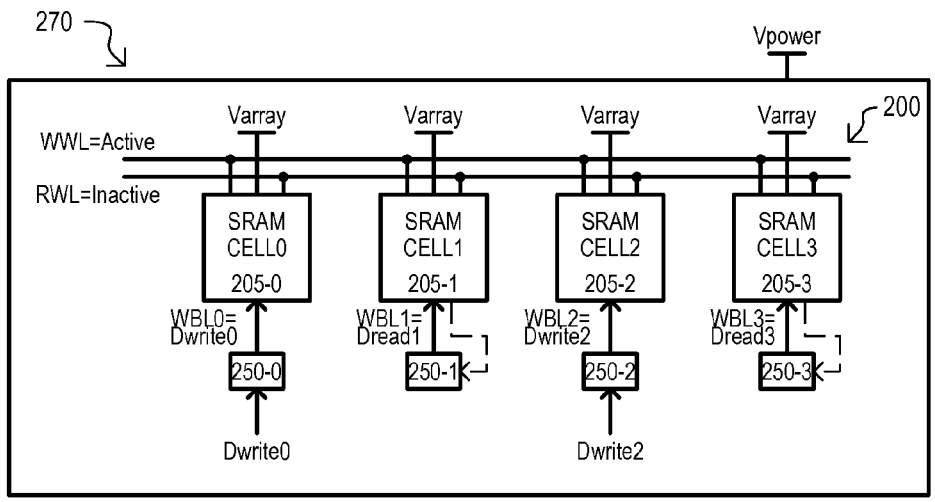

FIGS. 2A and 2B are a sequence of block schematic diagrams showing a write operation to an SRAM 200 of an integrated circuit 270. An integrated circuit 270 can include the SRAM 200, which can include a number of SRAM cells 205-0 to -3 and corresponding write circuits 250-0 to -3. SRAM 200 can receive a power supply voltage Varray. SRAM cells (205-0 to -3) can be arranged into interleaved groups, with the cells of one group being adjacent to those of another group. Thus, SRAM cells 205-0/2 can be in one interleaved group, while SRAM cells 205-1/3 can be in another interleaved group. Different interleaved groups are accessed in operations that access data of the SRAM cells (205-0 to -3). In the particular embodiment shown, a write operation to one address can write data to SRAM cells 205-0/2 and not to SRAM cells 205-1/3, while a write operation to another address can write data to SRAM cells 205-1/3 and not to SRAM cells 205-0/2. In the particular embodiment shown, SRAM cells (205-0 to -3) can be connected to a same write word line (WWL) which will be activated in a write to either interleaved group. Thus, an access to SRAM cells 205-0/2 can result in SRAM cells 205-1/3 being "half-selected", and vice versa. In the very particular embodiment of FIGS. 2A/B, SRAM cells (205-0 to -3) can be connected to a same read word line (RWL), which can be activated to read data from the SRAM cells (205-0 to -3). However, in alternate embodiments, SRAM cells of one interleaved group can be connected to one read word line, while SRAM cells of another interleaved group are connected to a different read word line.

Each of SRAM cells (205-0 to -3) can receive write data via one or more write bit lines (WBL0 to WLB3). In some embodiments, SRAM cells (205-0 to -3) can receive data via complementary write bit lines, which can be driven to complementary values in order to write data into the SRAM cells. However, in alternate embodiments, SRAM cells (205-0 to -3) can be single-ended, receiving write data via one write bit line. In some embodiments, each SRAM cell (205-0 to -3) can output read data via one or more read bit lines (not shown) that are separate from write bit lines.

Write circuits (250-0 to -3) can operate in different modes. In one mode (i.e., Select), a write circuit (250-0 to -3) can drive received write data on the write bit line(s) of its corresponding SRAM cell (205-0 to -3). However, in another mode (Deselect), a write circuit (250-0 to -3) can drive data read from the SRAM cell (205-0 to -3) on the write bit line(s) for the same SRAM cell (205-0 to -3). According to embodiments, an operational mode of a write circuit (250-0 to -3) can depend upon which interleaved group is subject to the write operation.

FIGS. 2A and 2B show a write operation to SRAM cells 205-0/2 according to one particular embodiment. FIG. 2A shows one portion of write operation, and FIG. 2B shows a subsequent portion of the same write operation. In such a write operation, write circuits (250-0/2) correspond to SRAM cells receiving write data, and so operate in the Select mode of operation. In contrast, write circuits (250-1/3) corresponding to SRAM cells not receiving write data (i.e., half-selected SRAM cells) operate in the Deselect mode of operation.

Referring to FIG. 2A, prior to the application of write data to SRAM cells 205-0/2, a read word line (RWL) can be activated while write word line (WWL) is not activated. This results in read data (Dread0 to Dread3) being output from all SRAM cells (205-0 to -3) to corresponding write circuits (250-0 to -3). Because write circuits 250-1/3 are in the Deselect mode, write bit line(s) WBL1 for SRAM cell 205-1 are driven with read data (Read1) from the same SRAM cell (205-1). Similarly, write bit line(s) WBL3 for SRAM cell 205-3 are driven with read data (Dread3) from the same SRAM cell (205-3). It is understood that such actions reinforce the data values already stored in the SRAM cells (205-1/3) thus making them less susceptible to disturb, or the like. As noted above, in some embodiments, read data may not be output from SRAM cells that are to receive write data (e.g., 205-0/2 in this example).

Referring to FIG. 2B, as write data is applied to bit line(s) (BL0/2) of SRAM cells 205-0/2, write word line (WWL) can be activated while read word line (RWL) is deactivated. Write data Dwrite0 can be driven on write bit line(s) (WBL0) for SRAM cell 205-0 and write data Dwrite2 can be driven on write bit line(s) (WBL2) for SRAM cell 205-2. At this time, SRAM cells 205-1/3 can be half-selected, but because read data (Dread1/3) continues to be driven on their write bit line (WBL1/3), the SRAM cells 205-1/3 are highly resistant to disturb, or other like effects.

Figure 2C:
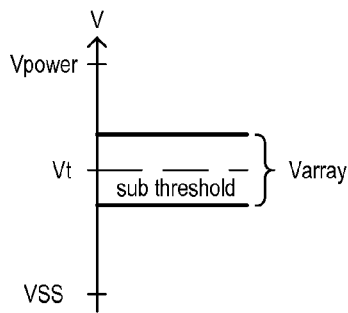
FIG. 2C shows operating voltage levels of SRAMs according to embodiments.

FIG. 2C is a graph showing voltage levels that can be present in an SRAM of an integrated circuit, according to an embodiment. FIG. 2C shows a device power supply level (Vpower), which can be a power supply voltage received by the integrated circuit; a low power supply level (VSS), which can be ground in some embodiments. FIG. 2C also shows a range of SRAM power supply levels (Varray) relative to a threshold voltage (Vt) value. Vt can be the threshold voltage of transistor within SRAM cells of the SRAM. In some embodiments, Vt can be the threshold voltage of n-channel insulated gate field effect transistors (e.g., MOSFETs) within such SRAM cells. In very particular embodiments, a Vt can be for DDC type transistors included within SRAM cells.

As shown, Varray can be near or below Vt. In some embodiments, Varray can be below Vt, and thus the SRAM can be a sub-threshold circuit. In other embodiments, Varray can be about equal to Vt. In still other embodiments, Varray can be near Vt. In particular embodiments, Varray can be no more than 250 mV above Vt. In one particular embodiment, Varray can be no more than 100 mV above Vt.

It is understood that while FIG. 2C shows Vpower to be greater than Varray, in some embodiments such voltages can be the same.

Figure 3A:
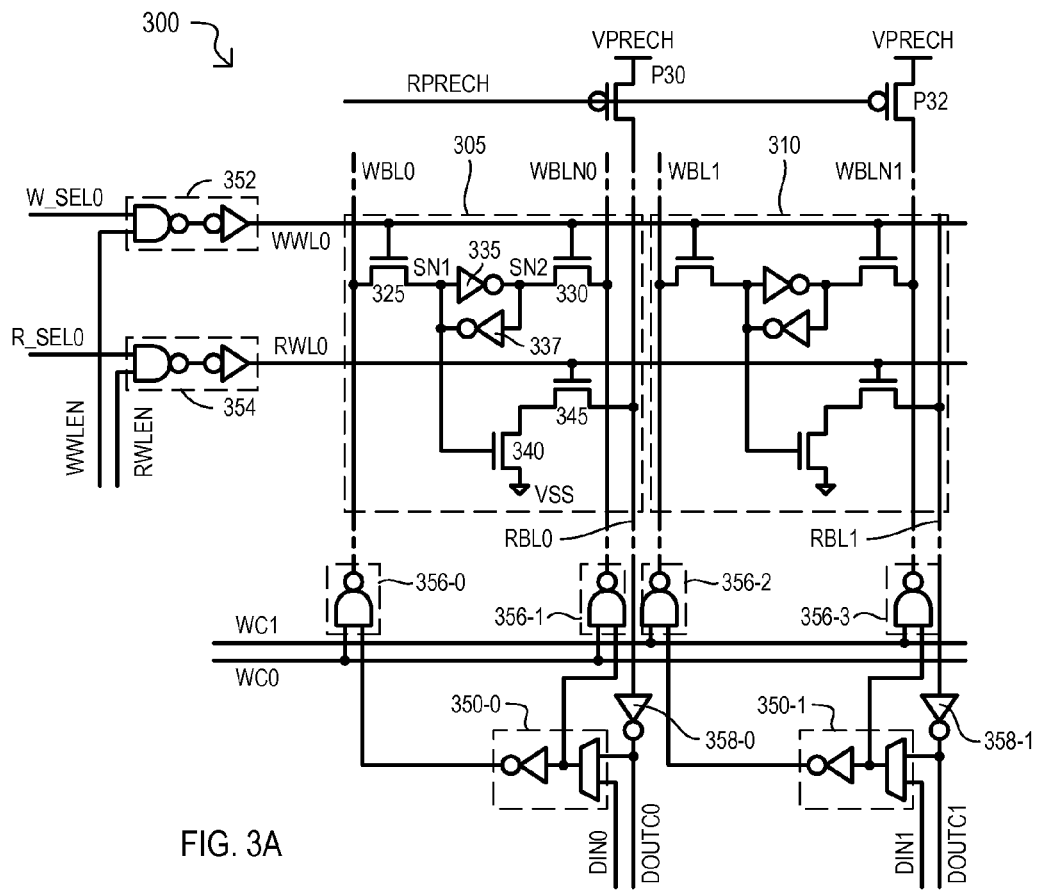
FIG. 3A is a block schematic diagram of an integrated circuit according to another embodiment.

FIG. 3A is a block schematic diagram of an integrated circuit including an SRAM 300 according to another embodiment. In one very particular embodiment, SRAM 300 can be one implementation of that shown as 200 in FIGS. 2A/B. SRAM 300 can include a number of SRAM cells, including SRAM cells arranged in multiple rows and columns. For ease of discussion, however, only two SRAM cells 305 and 310, each in separate columns are illustrated and discussed. SRAM cell 305 can be considered to be in column 0, while SRAM cell 310 can be considered to be in column 1. In addition to SRAM cells (305/310), FIG. 3A also shows precharge devices P30/P32, write word line driver 352, read word line driver 354, write bit line drivers 356-0 to -3, read output drivers 358-0/1, and write multiplexers (MUXs) 350-/1.

In FIG. 3A, each SRAM cell (e.g., 305) can include inverters 335/340 cross-coupled between storage nodes SN1/SN2. Storage node SN1 can be connected to a write bit line WBL0 by pass-gate transistor 325, and storage node SN2 can be connected to a complementary write bit line WBLN0 by pass-gate transistor 330. Pass-gate transistors 325/330 can have gates connected to write word line WWL0. Each SRAM cell (e.g., 305) can also include a read circuit formed by read transistors 340/345. Transistor 340 can have a gate connected to storage node SN1. Transistor 345 can have a gate connected to read word line (RWL0). Source-drain paths of transistors 340 and 345 can be connected in series between a read bit line (RBL0) and VSS.

In particular embodiments, pass-gate transistors 325/330 can be DDC transistors. Further, inverters 335/337 can be CMOS type inverters implemented using DDC transistors. The pass-gate transistors 325 and 330, and pull-down transistors that are part of the CMOS inverters can be NMOS transistors. Pass-gate transistors 325 and 330 connect write bit line pairs WBL0/WBLN0, also referred to as write data lines, to storage nodes SN1/SN2, respectively, where the voltages at nodes SN1 and SN2 are inversely related. The pull-down transistors that are part of the inverters 335 and 337 can selectively couple a power supply VSS, usually the ground voltage of the circuit, to the storage nodes SN1 and SN2, respectively. Pull-up transistors that are part of the CMOS inverters 335 and 337 are typically PMOS transistors that selectively connect the positive power supply (Varray, VDD) to the storage nodes SN1 and SN2 respectively.

The SRAM cell (e.g., 305) shown in FIG. 3A can retain its state indefinitely as long as the power supply voltage (Varray) is sufficient to operate the cell correctly, i.e., exceeds a minimum value ($V_{DDmin}$). The two inverters 335/340 operate to reinforce the stored charge on storage nodes SN1 and SN2 continuously, such that the voltages at each of the two storage nodes are inverted with respect to one another (i.e., are complementary). When SN1 is at a logical "1", usually a high voltage, SN2 is at a logical "0", usually a low voltage, and vice versa.

In particular embodiments, read transistors 340/345 can also be DDC transistors. Precharge device P30/P32 can precharge read bit lines (RBL0/1) to a precharge voltage prior to reading data from the SRAM cells (e.g., 305). As will be discussed in more detail below, SRAM 300 can read data in an initial part of a write operation. In particular embodiments, precharge devices P30/P32 can precharge read bit lines (RBL0/1) to a high array power supply voltage (i.e., VPRECH=Varray).

Write word line driver 352 can activate (drive high in this example) a corresponding word line (WWL0) according to write selection signal W_SEL0 and a write word line enable signal WWLEN. Similarly, read word line driver 354 can activate (drive high in this example) a corresponding read word line (RWL0) according to read selection signal R_SEL0 and a read word line enable signal RWLEN.

Write bit line drivers (356-0 to -3) can drive write bit lines WBL0/WBLN0, WBL1/WBLN1 according to a value output from a corresponding write MUX (350-0/1). More particularly, when write data is be written to an SRAM cell (e.g., 305), the corresponding write bit line drivers 356-0/1 can drive write bit lines WBL0/WBLN0 to complementary levels based on a received write data value. The write bit line drivers 356-2/3 of the adjacent SRAM cell (e.g., 310), which is half-selected, can drive write bit lines WBL1/WBLN1 to complementary levels based on read data from the same SRAM cell (i.e., 310).

Read output drivers 358-0/1 can provide read data values on corresponding read bit lines RBL0/RBL1 to write MUXs 350-0/1, respectively.

Write MUXs 350-0/1 can selectively output either write data (DIN0/DIN1) or read data (DOUTC0/DOUTC1) to corresponding write bit line driver pairs 356-0/1, 356-2/3.

Referring still to FIG. 3A, a write operation can be performed to store data in a selected SRAM cell, and a read operation can be performed to access stored data in a selected SRAM cell. The SRAM cells 305 and 310 have different read and write paths, which can be separately optimized for read and write operations. In one embodiment, write data can be stored in a selected SRAM cell (e.g., 305), during a write operation by placing complementary write data signals on the write bit lines WBL0 and WBLN0, and asserting the word line WWL0 connected to the SRAM cell 305. In the embodiment of FIG. 3A, the word line WWL0 is asserted by asserting the word select signal WSEL0 while the write word line enable signal WWLEN is asserted. Asserting WWL0 places a positive voltage on the gates of the pass-gate transistors 325 and 330, such that the two write bit lines WBL0 and WBLN0 are coupled to the storage nodes SN1 and SN2, respectively. The write operation is successful when the write data signals (e.g., DIN0 and its complement) on the two write bit lines (WBL0/WBLN0) overcome the voltages on the two storage nodes (SN1/SN2) (assuming the stored data does not match the write data) and modify the state of the SRAM cell (e.g., 305). Such an SRAM cell operation can be primarily due to the low driven write bit line overpowering a PMOS pull-up transistor within the corresponding inverter (335 or 340) via the corresponding pass-gate transistor (325 or 330). Thus the relative strength ratio of the NMOS pass-gate transistor to the PMOS pull-up transistor is important to maximizing the write margin.

Data can be accessed from a selected SRAM cell (e.g., 305), during a read operation by precharging the corresponding read bit line (RBL0) to a positive voltage VPRECH (such as the positive power supply voltage VDD), and asserting the read word line (RWL0) such that read transistors 345 and 340 allow the storage node SN1 to be coupled to the read bit line RBL0. The voltage on the read bit line RBL0 is sensed using the corresponding read output driver (358-0) to generate a read output signal on node DOUTC0. The voltage on the output node DOUTC0 can be subsequently output as the read data for the selected SRAM cell (e.g., 305).

Conventionally, during a write to SRAM cell 305, SRAM cell 310 is half selected, i.e., the write bit lines WBL1 and WBLN1 are not driven (also referred to as floating) which can result in a conventional SRAM-like read operation on SRAM cell 310, where the data stored in the cell is read out on its corresponding write bit lines (WBL1/WBLN1). Since the write rather than the read margin is optimized for the write port, SRAM cell 310 usually has its data disturbed in such an operation. One conventional solution would be to separate the WWLs for each SRAM cell, but typically this can result in a much larger cell layout (more horizontal metal pitches) and increased decoder complexity.

Unlike a conventional SRAM, the SRAM 300 shown in FIG. 3A can allow the columns selected for a write operation to take data from DIN0 or DIN1 (depending on whether column 0 or 1 is intended to write, respectively) and data fed back from a prior read operation for the column that is not selected for the write operation. This is facilitated by the write MUXs (350-0/1). By having the same data on the WBLs as contained in the half selected SRAM cell, instability can be alleviated, since if the SRAM cell writes, it receives the same data that is already inside the cell. The read/write cycle may be affected in the same clock phase using a self-timed circuit and operation as shown below, allowing minimal latency and logic complexity impact on the SRAM comprised of 8-T cells, which may be operating with a near or below-threshold voltage supply (i.e., Varray, VDD is at or near a Vt of transistors within the SRAM cells).

Figure 3B:
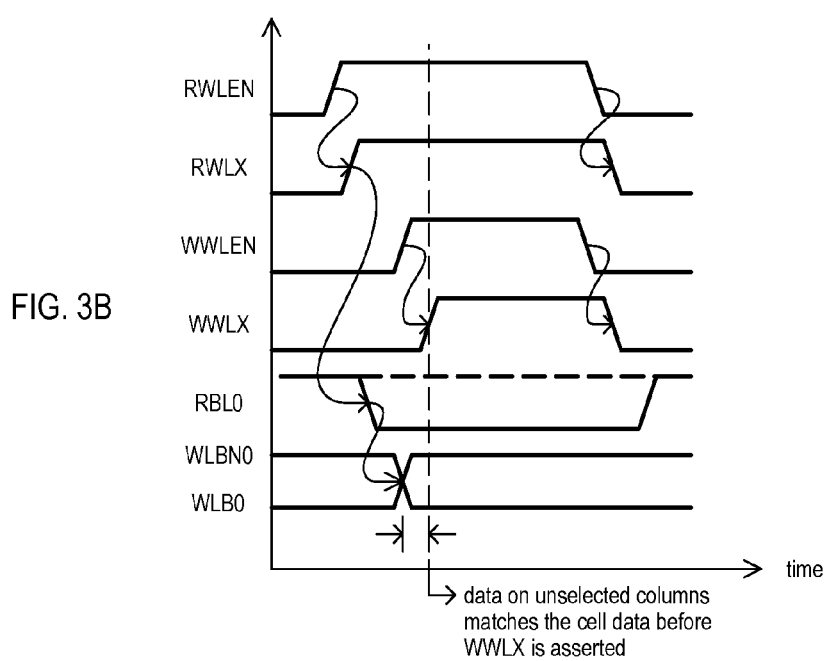
FIG. 3B is a timing diagram showing a write operation for a device like that of FIG. 3A.

FIG. 3B is a timing diagram that illustrates a method for performing write operations for the SRAM 300. The method for performing write operations can avoid the half-select disturb problem by reading the data stored in each half-selected SRAM cell and writing it back in the SRAM cell. Thus, each half-selected SRAM cell is written with exactly the same data that was stored in the SRAM cell, thereby enhancing the stability of the half-selected SRAM cells, which can result in avoiding the half-select disturb problem.

In the particular embodiment shown in FIG. 3B, data from half-selected SRAM cells are read out on the read bit lines and fed back (e.g., by coupling the read bit lines to the corresponding write bit lines) to establish the data already stored by the SRAM cell on its write bit lines before the write word line is asserted, and subsequently, such data is written back into the respective half-selected bit cell when the write word line is asserted.

FIG. 3B shows various waveforms including RWLEN (read word line enable signal); RWLx (read word line, such as RWL0); WWLEN (write word line enable signal); WWLx (write word line, such as WWL0); RBL0 (a read bit line of a half-selected SRAM cell); and WLB0/WLBN0 (the write bit line pair of the half-selected SRAM cell).

Referring to FIG. 3B, a method for performing write operations can start with asserting the RWLEN signal. The RWLEN signal acts as a clock that sets the timing for assertion of the read word line (labeled as RWLx). The data from each SRAM cell that is selected as a result of asserting the read word line RWLx is read and driven onto the read bit line (e.g., RBL0/1) for that SRAM cell (e.g., 305/310).

Referring back to FIG. 3A, in addition, one or more control signals WCx can be asserted for each SRAM cell that will be half-selected in the write operation, thereby coupling the read bit line to the write bit lines for each half-selected SRAM cell. In the embodiment shown in FIG. 3A, when SRAM cell 305 is half-selected, data on read bit line RBL0 is driven, in a complementary fashion, on write bit lines WBL0/WBLN0 upon the assertion of the control signal WC0. When SRAM cell 310 is half-selected, data on read bit line RBL1 is driven, in a complementary fashion, on write bit lines WBL1/WBLN1 upon the assertion of the control signal WC1.

Preferably, the control signals WC0/1, the read word lines RWLx, and the signal RWLEN are asserted such the data on the write bit lines of each half-selected SRAM cell is stable at a predetermined setup time before the write word line WWLx is asserted for the write operation, although this setup time may be negative in some embodiments.

Referring still to FIG. 3B, upon the assertion of the write word line enable WWLEN and the write word line WWLx signals, the data on the write bit lines of the SRAM cells connected to the asserted write word line is written into the respective SRAM cells. For the fully selected SRAM cells, write data driven on the write bit lines is stored in the respective bit-cells. For the half-selected SRAM cell the data on the write bit lines is exactly the same as the stored data that was read out from the same cell, and therefore, the stored data is written back into the half-selected SRAM cells. Therefore, the half select disturb problem is substantially eliminated for the half selected SRAM cells as the data stored in these cells at the onset of the write operation is written back into these cells when the word line connected to these cells is asserted.

In this way, in a write operation, the assertion of a write word line can be delayed with respect to the assertion of a read word line, to ensure read data is stable on the half-selected SRAM cells.

In some embodiments, a write word line enable signal (WWLEN) can be timed with a simple delay. However, in alternate embodiments, such a signal can be self-timed with respect to read data.

Figure 4:
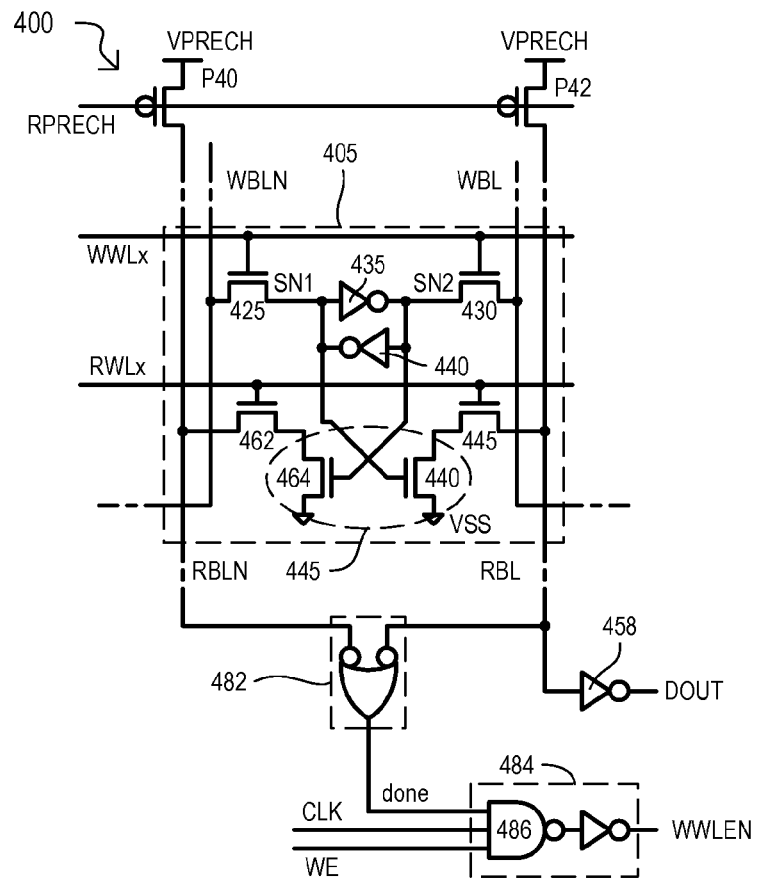
FIG. 4 is a block schematic diagram of an integrated circuit according to a further embodiment.

FIG. 4 illustrates an SRAM 400 that can include circuits for generating a self-timed WWLEN signal, in accordance with one embodiment. FIG. 4 shows a portion of one column in an SRAM array. It is understood that according to embodiments, one or more such columns can be included in each array, to provide write word line activation timing for such an SRAM array. More specifically, only two columns need to be differential, with their outputs logically "or", since the important read is from the column group(s) not writing. Thus, assuming the first two columns are differential, and there are write groups interleaved by four, in the case where the first columns, for instance, columns 0, 4, 8, etc. are writing, the read will be in columns 1, 2, 3, 5, 6, 7, 9, 10, 11, etc. so that timing will be provided by the second differential column, for instance, column 1. In the event that columns 1, 5, 9, etc. write, the timing will be provided by the first differential column. For the other cases, in other words, write to columns 2, 6, etc. and 3, 7 etc., the fastest of both differential columns will provide the timing. SRAM 400 can have a differential, rather than single-ended readout. Since the readout is differential, it can provide a way of determining when a read operation is complete (as complementary read data values will appear the differential readout).

SRAM 400 can include items like those of FIG. 3A, and such like items are referred to by the same reference character, but with the leading digit being a "4" instead of a "3".

SRAM 400 can differ from that of FIG. 3A in that an SRAM cell 405 can further includes read transistors 462/464. Transistor 464 can have a gate connected to storage node SN2. Transistor 462 can have a gate connected to the read word line (RWLx). Source-drain paths of transistors 464 and 462 can be connected in series between a second read bit line (RBLN) and VSS. Thus, when read word line (RWLx) is asserted complementary values at storage nodes SN1 and SN2 can be regenerated on read bit lines RBLN and RBL, respectively. A cross-coupling 445 of read transistors 440/464 can enable a differential output of a read data value. Read bit lines RBL/RBLN can be precharged by precharge devices P42 and P40, respectively.

SRAM 400 can also differ from that of FIG. 3A in that it can include a differential data detector 482 and write word line enable logic 484. Differential data detector 482 can generate a signal "done" that has one value (e.g., low) when read bit lines RBL/RBLN are precharged to a same value, and another value (e.g., high) when bit lines are driven to differential values (i.e., stable read data is present on the read bit lines RBL/RBLN). Write word line enable logic 484 can activate a word line enable signal WWLEN when a clock signal CLK, write enable signal WE and the "done" signal are all active. Only two differential columns would be needed to provide the self-timing of the WWLEN in any array.

In a write operation, complementary read bit lines RBL/RBLN can be precharged prior to activating the read word line RWLx. The activation of the read word line RWLx causes the output of the differential readout circuit (440, 445, 462, 464) to be driven on the complementary read bit lines RBL/RBLN, such that the complementary bit lines RBL/RBLN are driven with non-inverted and inverted values of the SRAM cell data, respectively. Since either RBL or RBLN will discharge when the complementary bit lines are stable, a "done" signal is generated by combining RBL and RBLN (i.e., the output of the NAND gate 486) can provide a timing signal that indicates that the complementary read bit lines (RBL/RBLN) are stable. Subsequent gating and buffering can be used to provide a predetermined delay between the "done" signal and the write word line enable signal (WWLEN), the predetermined delay can be sufficient to ensure that the write bit lines WBLx of half-selected bit cells in the SRAM array are fully driven before the WWLEN signal is asserted.

It is noted that while the SRAM cells (including 8-T cells) described herein can be implemented all, or in part, with DDC transistors, in alternate embodiments, such SRAM cells can be implemented, all or in part, using conventional transistors, including conventional MOSFETs. Embodiments utilizing conventional transistors can substantially eliminate the half select disturb problems as described herein.

However, embodiments described herein that use DDC transistors can provide additional benefits such as enhanced performance characteristics as compared to SRAM cells using conventional MOSFETs. Some of the reasons for the enhanced performance characteristics are (1) the DDC transistors have lower threshold voltage variation, i.e., lower $\sigma V_T$, and (2) the DDC transistors have higher $I_{eff}$ and higher body coefficient. As a result, SRAM cells using DDC transistors can have (1) enhanced read stability that can be measured as enhanced read static noise margin, as well as lower SRAM minimum operating voltage $V_{DDmin}$; (2) enhanced write margin; (3) faster SRAM operation resulting from lower read current variability; and (4) lower SRAM cell leakage resulting from lower $\sigma V_T$.

Figure 5:
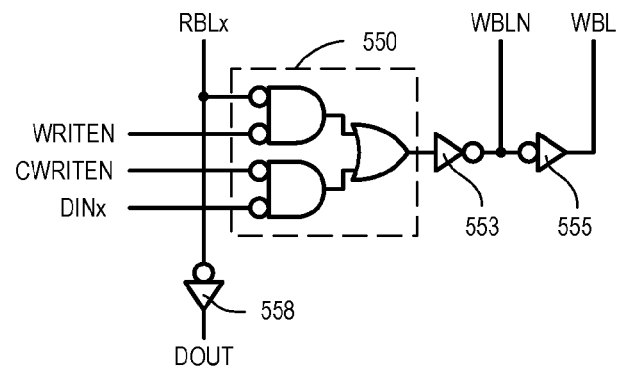
FIG. 5 is a schematic diagram of a multiplexer (MUX) and related circuits according to an embodiment.

As noted above, embodiments can include MUXs that can selectively apply received write data or read data (that reinforces a current stored state) to an SRAM cell. A MUX and associated column circuitry according to one particular embodiment is shown in FIG. 5. Because a MUX, as described herein, can drive write bit lines according to read data, it may be desirable to ensure that write bit lines can be insulated from write data values during other operations (i.e., insulated from data values on a write data input bus line shared with other circuit blocks, such as other SRAM arrays). One such arrangement is shown in FIG. 5.

FIG. 5 includes a MUX 550, read output driver 558, and write bit line drivers 553 and 555. A MUX 550 can receive a read data value (via read bit line RBLx) as well as a write data value (DINx). In addition, MUX 550 can receive write control signals WRITEN and CWRITEN.

When WRITEN is asserted (low in this example) and CWRITEN is de-asserted (high in this example), write bit lines WBLNx/WBLx can be driven to complementary values according to the read data value on read bit line (RBLx). When WRITEN is de-asserted and CWRITEN is asserted, write bit lines WBLNx/WBLx can be driven to complementary values according to received write data DINx. These two modes provide MUXing between the read data and received write data.

However, when WRITEN and CWRITEN are both de-asserted, the write bit lines (WBLNx/WBLx) are maintained at predetermined logic levels regardless of the write data input DINx (and regardless of the read data value on RBLx, as well). In this manner, the write bit lines (WBLNx/WBLx) do not respond to data toggling on the data input bus (i.e., do not response to DINx). This may save substantial power since the write bit lines (WBLNx/WBLx) will not toggle when the data bus (i.e., DINx) toggles, for example, to drive another SRAM block or other IC block. Thus, MUXing between read and write data values is possible while write bit line activity is minimized.

As noted herein, embodiments can include SRAM operating with power supplies at near or below-threshold voltage levels. As also noted herein, threshold voltage levels of transistors can be established by body biasing. According to embodiments, threshold voltages for SRAM cell transistors can be established using body biasing, and a power supply voltage provided to such SRAM cells can be at near, or sub-threshold voltage levels. One such embodiment is shown in FIG. 6.

Figure 6:
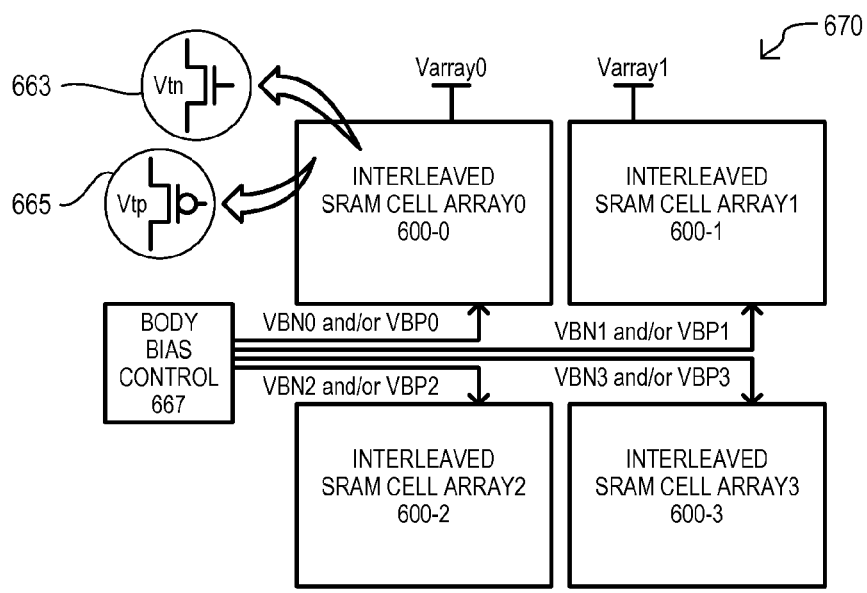
FIG. 6 is a block schematic diagram of an integrated circuit according to another embodiment.

FIG. 6 is a block schematic diagram of an integrated circuit 670 according to one embodiment. An integrated circuit 670 can include a number of SRAMs 600-0 to -3 and a body bias control circuit 667. SRAMs (600-0 to -3) can have SRAM cells arranged in an interleaved arrangement, as described herein, or equivalents. SRAMs (600-0 to -3) can include n-channel transistors (one shown as 663) and/or p-channel transistors (one shown as 665) which can be subject to a body bias voltage. Such a body bias voltage can establish the threshold voltage (Vtn or Vtp) of the transistors. In particular embodiments, transistors (e.g., 663 or 665) can be DDC transistors. SRAMs (600-0 to -3) can each receive a power supply voltage Varray0 to Varray3. Array power supply voltages (Varray0 to Varray3) can be the same, or can be different between SRAMs (600-0 to -3). Further, power supply voltages (Varray0 to Varray3) can also vary according to mode of operation.

Body bias control circuit 667 can provide body bias voltages to each SRAM (600-0 to -3), to establish threshold voltages (Vtn and/or Vtp) of transistors within such SRAMs (600-0 to -3). Body bias voltages can be for n-channel transistors (e.g., VBN0 to -3) and/or for p-channel transistors (e.g., VBP0 to -3). In some embodiments, the body bias voltages provided to SRAMs (600-0 to -3) can be the same, in other embodiments such body bias voltages can be different. In general, the NMOS body biases can be the same for entire arrays, since the interleaving space is insufficient to allow Nwell separation. However, the body bias on the arrays may be separate from the surrounding logic, providing for an optimal SRAM performance/leakage response. In the case of a body bias scheme tailored for the arrays, all PMOS and NMOS transistor body bias voltages can be the same for each of the interleaved arrays. Where the NMOS body bias voltage is the same as for the logic transistors, and if a triple well structure is not used, then the PMOS body bias may vary by column thus setting up for an ability to apply a specific body bias for each column or group of columns. Further, in some embodiments, body biases can be dynamic, varying in response to operating conditions and/or modes of operation. For instance, it may be useful to raise PMOS reverse body bias to weaken columns that are being written in order to improve the cell write margins.

Accordingly, in some embodiments, an array supply voltage Varray can be selected for one or more SRAMs (600-0 to -3). Body bias voltages can then be applied to adjust the threshold voltages of transistors (Vtn and/or Vtp) within the SRAMs (600-0 to -3) to provide a predetermined relationship between Varray and the threshold voltages. That is, threshold voltages can be adjusted so that an SRAM can operate in a near or sub-threshold supply level.

Figure 7A:
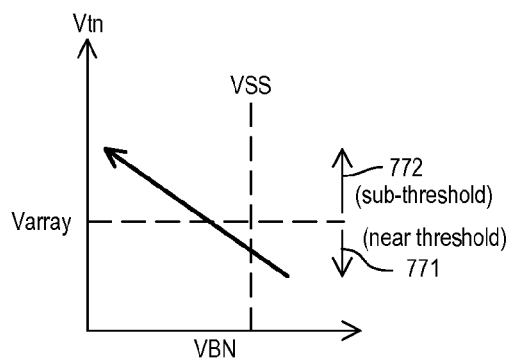
FIGS. 7A and 7B are diagrams showing how body bias voltages can be utilized to adjust transistor threshold voltages and arrive at near- or sub-threshold operation levels.
Figure 7B:
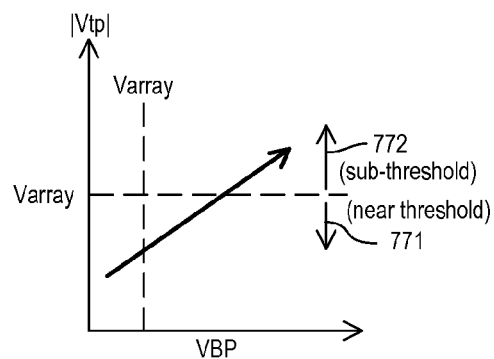

FIGS. 7A and 7B are graphs showing how threshold voltages can be set based on an applied body bias voltage, to arrive at near or sub-threshold modes of operation. FIG. 7A shows how a Vtn can be adjusted based on an applied n-channel body bias voltage (VBN). For a given array power supply voltage Varray, varying VBN can enable operations to be adjusted to sub-threshold 772 or near threshold 771 levels. FIG. 7A also shows a low power supply level (VSS). FIG. 7B shows a graph like of FIG. 7A but for a p-channel transistor threshold (Vtp). FIG. 7B includes a high power supply level (Varray).

It is understood that FIGS. 7A and 7B are provided to show a general relationship between body bias voltages, threshold voltages, and an array power supply level. Such relationship is not necessarily linear and will vary according to device type and configuration.

Embodiments above have shown various devices, circuits and corresponding methods. An additional method will now be described with reference to FIG. 8.

Figure 8:
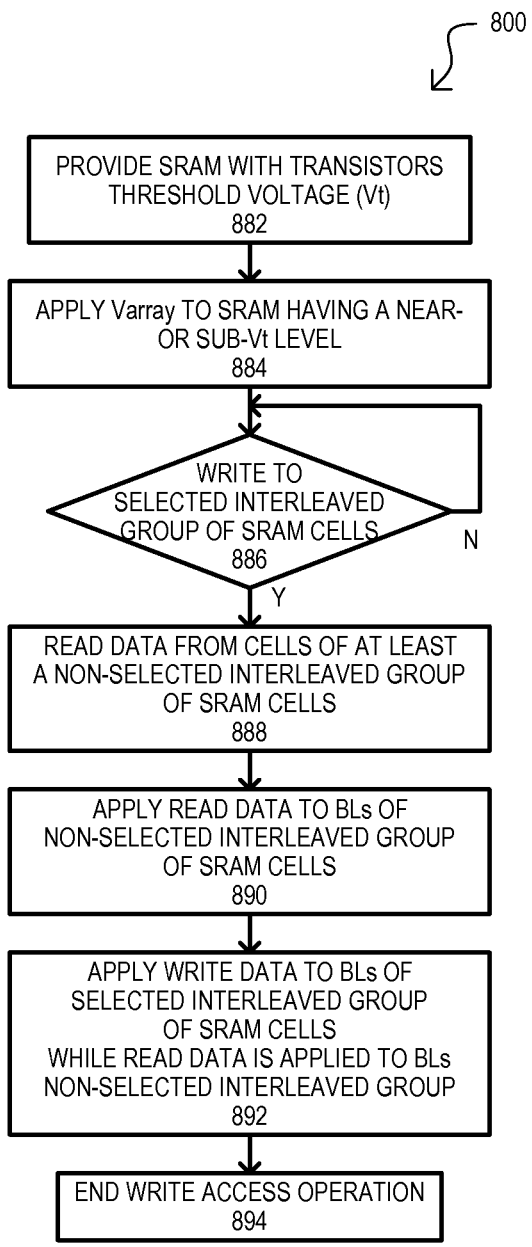
FIG. 8 is a flow diagram of a method according to an embodiment.

FIG. 8 is a flow diagram of a method 800 according to an embodiment. A method 800 can include providing an SRAM with transistors having a threshold voltage (Vt) (882). Such an action can include manufacturing transistors having a Vt, adjusting transistor threshold voltages with body biasing arrive at the Vt, or combinations thereof. In some embodiments, such an action can include providing DDC transistors as SRAM transistors. In particular embodiments, DDC transistors can form pull-down and/or pull-up transistors within cross-coupled inverters of SRAM cells.

A method 800 can further include applying an array power supply voltage (Varray) that having a near threshold or sub-threshold level (884). According to some embodiments, a near threshold voltage level can be no more 250 mV over Vt. In other embodiments, a near threshold voltage level can be no more 1000 mV over Vt.

A method 800 can include determining if write operations are to occur to an interleaved group of SRAM cells (886). If such a write operation takes place (Y from 886), data can be read from at least a non-selected group of interleaved SRAM cells (888). A non-selected group of interleaved SRAM cells can be cells adjacent to those that are to receive write data in the write operation, but are not to receive write data themselves. In some embodiments, such an action can include reading data from the selected group of interleaved SRAM cells as well.

Read data can be applied to bit lines of the non-selected group of interleaved SRAM cells (890). Such an action can ensure the bit lines for the non-selected group of SRAM cells reinforces the data already stored in such SRAM cells.

Write data can be applied to bit lines of the selected group of interleaved SRAM cells while read data is applied to bit lines of non-selected SRAM cells (892). Such an action can write desired data to the SRAM cells, while insulating non-selected SRAM cells from disturb effects, or the like.

A write access operation can then end (894).

Embodiments of various structures and manufacturing processes suitable for use in DDC transistors are disclosed in U.S. Pat. No. 8,273,617 issued Sep. 25, 2012, titled "Electronic Devices and Systems, and Methods for Making and Using the Same", by Scott E. Thompson et al.; U.S. Pat. No. 8,530,286 issued on Sep. 10, 2013 titled, "Low Power Semiconductor Transistor Structure and Method of Fabrication Thereof", by Lucien Shifren et al; U.S. patent application Ser. No. 12/971,955 filed on Dec. 17, 2010 titled "Transistor with Threshold Voltage Set Notch and Method of Fabrication Thereof"; U.S. patent application Ser. No. 12/895,785 filed on Sep. 30, 2010 titled "Advanced Transistors With Threshold Voltage Set Dopant Structures"; and U.S. Pat. No. 8,400,219 issued on Mar. 19, 2013, titled "Analog Circuits Having Improved Transistors, and Method Therefor", by Lawrence T. Clark et al; the disclosures of which are hereby incorporated by reference in their entirety. In addition, methods and structures for modifying the threshold voltage of DDC transistors are discussed in pending U.S. patent application Ser. No. 13/459,971 titled "Multiple Transistor Types Formed in a Common Epitaxial Layer by Differential Out-diffusion from a Doped Underlayer", filed Apr. 30, 2012, the entirety of which disclosure is incorporated by reference herein.

It is understood that, with appropriate change to substrate or dopant material, conductivities of any of the transistors described above can be switched (i.e., from p-channel to n-channel and vice versa).

The 8-T SRAM cells discussed above are advantageously used in IC devices that are implemented using DDC transistors because of the enhanced body coefficient as compared to conventional nanoscale devices. The strong body of the DDC transistor provides a wider ranging response from a wider range to body bias voltage that can be applied to the body. The screening region of the DDC transistor makes the DDC transistor particularly amenable to implementation with controllable back body biasing techniques. More specifically, the enhanced body coefficient of the DDC transistor can allow a broad range of ON-current and OFF-current that depends on the body bias voltage applied to the DDC transistor body, as compared to the body bias voltage used with a conventional device. In addition, the DDC transistors have a better $AV_T$, i.e., a lower $\sigma V_T$ than conventional devices. The lower $\sigma V_T$ provides a lower minimum operating voltage VDD and a wider range of available nominal values of $V_T$. The enhanced body coefficient of the DDC transistor allows for a broader range of threshold voltage realizable using body bias voltage compared with the threshold voltage that can be achieved on a conventional device using body bias. With a DDC transistor, effective body biasing can be used for improved control of the operating conditions of a device or a group of devices to be set by way of controlling the applied body bias voltage. In addition, different operating conditions, including near or sub-threshold device operation can be set for devices or groups of devices by way of applying different body bias voltages.

As will be understood, wafers and die supporting multiple transistor types, including those with and without the described dopant layers and structures are contemplated. Electronic devices that include the disclosed transistor structures or are manufactured in accordance with the disclosed processes can incorporate die configured to operate as "systems on a chip" (SoC), advanced microprocessors, radio frequency, memory, and other die with one or more digital and analog transistor configurations, and are capable of supporting a wide range of applications, including wireless telephones, communication devices, "smart phones", embedded computers, portable computers, personal computers, servers, and other electronic devices. Electronic devices can optionally include both conventional transistors and transistors as disclosed, either on the same die or connected to other die via motherboard, electrical or optical interconnect, stacking or through used of 3D wafer bonding or packaging. According to the methods and processes discussed herein, a system having a variety of combinations of analog and/or digital transistor devices, channel lengths, and strain or other structures can be produced.

Accordingly, while the various aspects of the particular embodiments set forth herein have been described in detail, the present invention could be subject to various changes, substitutions, and alterations without departing from the spirit and scope of the invention.

What is claimed is:

1. A method, comprising:
    applying a device power supply voltage to an integrated circuit including a static random access memory (SRAM) with transistors having at least a first threshold voltage (Vt);
    applying an array power supply voltage to cells of the SRAM that is near or below Vt; and
    in a write operation,
        reading data from at least a first group of the cells that is interleaved with a second group of the cells, and
        applying the read data to the bit lines of the first group of cells, while write data is applied to the bit lines of the second group of cells.

2. The method of claim 1, wherein:
    the array power supply voltage is less than Vt.

3. The method of claim 1, wherein:
    the array power supply voltage is no more than 250 mV greater than Vt.

4. The method of claim 3, wherein:
    the array power supply voltage is no more than 100 mV greater than Vt.

5. The method of claim 1, further including:
    body biasing the transistors to set their threshold voltage to Vt.

6. The method of claim 1, further including:
    dynamically body biasing the transistors to change their threshold voltages between Vt and another value.

7. The method of claim 1, wherein:
the cells comprise eight transistor SRAM cells.

8. An integrated circuit, comprising:
at least one static random access memory (SRAM) comprising cells arranged into interleaved groups configured to receive an array power supply voltage; and
write circuits configured to apply data read from one of the interleaved groups to bit lines of the interleaved group and while write data is applied to bit lines of the other of the interleaved groups; wherein
the cells comprise transistors having at least a first threshold voltage (Vt), and the array power supply voltage is near or below Vt.

9. The integrated circuit of claim 8, wherein:
the array power supply voltage is less than Vt.

10. The integrated circuit of claim 8, wherein:
the array power supply voltage is no more than 250 mV greater than Vt.

11. The integrated circuit of claim 8, wherein:
the array power supply voltage is no more than 100 mV greater than Vt.

12. The integrated circuit of claim 8, further including:
body biasing circuits configured to generate a body bias voltage to the transistors that sets their threshold voltage to Vt.

13. The integrated circuit of claim 8, wherein:
the cells comprise eight transistor SRAM cells.

14. An integrated circuit, comprising:
a plurality of static random access memory (SRAM) cells arranged into interleaved groups, the plurality of SRAM cells comprising columns, the plurality of SRAM cells coupled to receive an array power supply voltage, each SRAM cell including
a latch circuit coupled to at least one write bit line by a first access device coupled to a write word line, the latch circuits comprising transistors having at least a first threshold voltage (Vt), and
a read circuit configured to establish a voltage on a read bit line in response to activation of a corresponding read word line;
write circuits configured to apply data read from one of the interleaved groups to write bit lines of the interleaved group while applying write data to write bit lines of the other of the interleaved groups; wherein
the array power supply voltage is near or below Vt.

15. The integrated circuit of claim 14, wherein:
the array power supply voltage is less than Vt.

16. The integrated circuit of claim 14, wherein:
the array power supply voltage is no more than 250 mV greater than Vt.

17. The integrated circuit of claim 14, wherein:
the write circuits each include a multiplexer (MUX) having one input coupled to a read bit line, another input coupled to receive a write data value, and an output coupled to a write bit line coupled to the same SRAM cells as the read bit line.

18. The integrated circuit of claim 14, wherein:
the SRAM cells comprise eight transistor (8-T) SRAM cells.

19. The integrated circuit of claim 14, further including:
the read circuit of at least two of the SRAM cell columns comprises a differential read circuit configured to establish complementary voltages on complementary read bit lines in response to activation of a corresponding read word line; and
a detect circuit configured to detect when the read bit lines have complementary values, wherein a write control signal is asserted after a complementary read value has been detected.

20. The integrated circuit of claim 14, further including:
body biasing circuits configured to apply a body bias voltage to the SRAM cells to establish the threshold voltage of Vt.

* * * * *